US006387801B1

(12) United States Patent
Lee

(10) Patent No.: US 6,387,801 B1
(45) Date of Patent: May 14, 2002

(54) METHOD AND AN APPARATUS TO ELECTROLESS PLATE A METAL LAYER WHILE ELIMINATING THE PHOTOELECTRIC EFFECT

(75) Inventor: Jin-Yuan Lee, Hsinchu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 09/707,295

(22) Filed: Nov. 7, 2000

(51) Int. Cl.[7] .............................................. H01L 21/44

(52) U.S. Cl. ....................................... 438/678; 118/690

(58) Field of Search .......................... 438/678; 118/690, 118/691

(56) References Cited

U.S. PATENT DOCUMENTS

| | | | | |
|---|---|---|---|---|
| 4,499,852 A | * | 2/1985 | Castner | 118/690 |
| 4,699,081 A | | 10/1987 | Mack | 118/691 |
| 4,707,378 A | | 11/1987 | McBride et al. | 427/8 |
| 5,834,366 A | * | 11/1998 | Akram | 438/614 |
| 5,925,415 A | * | 7/1999 | Fry et al. | 427/304 |

* cited by examiner

*Primary Examiner*—David Nelms
*Assistant Examiner*—Thao P Le
(74) *Attorney, Agent, or Firm*—George O. Saile; Stephen B. Ackerman; Douglas R. Schnabel

(57) ABSTRACT

A new method of electroless plating a metal layer onto a semiconductor substrate in the manufacture of an integrated circuit device has been achieved. A semiconductor substrate is provided. A metal layer is electroless plated onto the semiconductor substrate. Light is shielded from the semiconductor substrate to thereby eliminate the photoelectric effect in the semiconductor substrate during the electroless plating. A new apparatus for electroless plating a metal layer onto a semiconductor substrate is achieved. The apparatus comprises, first, an electroless plating tank capable of holding an electroless plating solution. The sidewalls and bottom of said electroless plating tank prevent light intrusion into the electroless plating solution during a plating process. Second, a wafer fixture capable of suspending a semiconductor substrate wafer in the electroless plating solution in the electroless plating tank during the plating process is provided. Third, a light shielding cover capable of preventing light intrusion into the electroless plating solution through the top opening of the electroless plating tank during the plating process is provided.

20 Claims, 4 Drawing Sheets

116
112
108
104
100

METHOD AND AN APPARATUS TO ELECTROLESS PLATE A METAL LAYER WHILE ELIMINATING THE PHOTOELECTRIC EFFECT

BACKGROUND OF THE INVENTION (1) Field of the Invention

The invention relates to a method and an apparatus for electroless plating, and more particularly, to a method and an apparatus for electroless plating of a metal layer in the manufacture of an integrated circuit device.

(2) Description of the Prior Art

Electroless plating is an important process in the manufacture of integrated circuit devices. Electroless plating is used in the deposition of metal layers for interconnect levels and for input/out (I/O) pads.

Electroless plating may be defined as the deposition of a metal coating by immersion of a substrate in a suitable solution containing a chemical reducing agent. Metal ions in the solution are reduced by the chemical reducing agent and deposit on the substrate. Electroless plating resembles electroplating but is simpler and does not require an electric current. Due to the processing simplicity, electroless plating is particularly attractive for use in the fabrication of I/O pads with bumps.

Referring now to FIG. 1, a simplified, cross section of an electroless plating apparatus is shown. The basic components of the apparatus are the tank 10 and the wafer fixture 18. The tank 10 may be a very simple container that holds the plating solution 14 and that does not react with the solution 14. The wafer fixture 18 holds the semiconductor substrate 22. The semiconductor substrate 22 is typically called a wafer. The wafer fixture 18 may hold a group of wafers, usually called a wafer lot or wafer batch. The wafer fixture 18 is constructed of a material that will not react with the plating solution 14.

In a process run, the wafer 22 or wafer lot is loaded onto the wafer fixture 18. The wafer fixture 22 indexes down to immerse the wafer 22 into the plating solution 14. The plating solution typically contains many chemicals, including the plating metal ions and the reducing agent. The wafer fixture 18 may then move vertically and/or laterally to agitate the plating solution 14 and improve plating uniformity. The wafer fixture 18 suspends the wafer 22 in the solution for a predetermined period of time to plate a desired thickness of metal onto the semiconductor substrate surface. The wafer fixture 18 then indexes to the up position to remove the wafer 22 from the plating solution 14. A rinsing operation may then be performed to remove any residual solution from the wafer 22.

This simplified electroless plating apparatus of FIG. 1 does not show many other features such as solution reservoirs, pumps, drains, motors, and controllers, that a state of the art apparatus would contain. However, for the purpose of explaining the concepts of the present invention, the simplified apparatus schematic is sufficient.

Note that ambient light 26 may penetrate into the plating solution 14 and strike the semiconductor substrate 22. Light may enter the plating solution 14 through the opening at the top of the tank 10. In addition, light may be transmitted through the sidewalls or the bottom of the tank 10. In many applications of electroless plating, the presence of ambient light in the reaction is not a problem. However, for the case of a semiconductor substrate, this light can be detrimental to the plating process.

Referring now to FIG. 2, a cross section of an integrated circuit device is shown. This integrated circuit device has a substrate 30 comprising a semiconductor material such as monocrystalline silicon. In this example, the substrate 30 is lightly doped p-type. An n-type well 34 is also formed in the substrate 30. A passivation layer 38 is formed overlying the surface of the substrate 30. Openings have been formed in the passivation layer 38 for I/O pads. A first pad layer of aluminum 42 has been deposited in the pad openings.

The semiconductor substrate 30 is then submitted to the electroless plating process described in FIG. 1 to plate a layer of nickel overlying the aluminum layer 42. Ambient light 46 enters the plating solution as described above. A portion of this light 46 strikes the semiconductor substrate in the n-type well 34.

Referring now to FIG. 3, an electron energy state diagram for the silicon substrate is shown. Electrons in the crystal silicon structure are in either the valence band or the conduction band. Electrons in the valence band have energy of or below $E_{valence}$. Electrons in the conduction band have energy of or above $E_{conduction}$. When electrons are in the valence band, they are held by the silicon atom. When electrons enter the conduction band, they have sufficient energy to leave the silicon atom and are then said to be available for conduction. A gap exists between the valence band and the conduction band. This gap is called the gap energy or $E_{gap}$. When a light photon strikes the electron, energy is transferred to the electron. If the energy is sufficient to overcome the energy gap, the electron will enter the conduction band. This is called the photoelectric effect.

Referring once again to FIG. 2, the photo energy of the light 46 causes a photoelectric effect in the semiconductor substrate. An electron-hole carrier pair, 50 and 54, is generated by photoelectric action. A charging action occurs so that the bond pad overlying the substrate 30 exhibits a positive potential with respect to the adjacent bond pad overlying the n-type well 34. This electrochemical potential difference causes poor electroless plating quality. This is especially true for the ground pad for the integrated circuit device.

In "Designing a Modular Chip-Scale Package Assembly Line," by T. DiStefano et al, March 1997, the use of a bump pad process is discussed for applications using chip-scale packaging.

Several prior art approaches disclose methods or apparatus for electroless plating. U.S. Pat. No. 4,707,378 to McBride et al discloses a method and an apparatus to control organic contamination levels in an electroless plating bath. A potentiostat is used to measure the contaminant level. An uncovered plating bath is depicted. U.S. Pat. No. 4,699,081 to Mack teaches an apparatus for detecting and adjusting the metal salt concentration in an electroless plating bath. A probe, including a light source and a detector, is placed into the plating tank to monitor the concentration of metal salt based on the light intensity detected. U.S. Pat. No. 5,925,415 to Fry et al discloses a method to electroless plate a metal coating. The metal coating is selectively plated over a monatomic metal layer but not over pendant hydroxy groups. U.S. Pat. No. 4,499,852 to Castner teaches an apparatus for regulating the concentration of dissolved metal in an electroless plating tank. The regulating apparatus comprises a rigid, transparent block with a light source and a light sensor.

SUMMARY OF THE INVENTION

A principal object of the present invention is to provide an effective apparatus and very manufacturable method to electroless plate a metal layer in the manufacture of an integrated circuit device.

A further object of the present invention is to provide an apparatus to electroless plate a metal layer onto a semiconductor substrate.

A yet further object is to provide an electroless plating apparatus that prevents light intrusion into the plating tank so that the photoelectric effect is eliminated in the semiconductor substrate.

Another further object of the present invention is to provide a method to electroless plate a metal layer onto a semiconductor substrate.

Another yet further object of the present invention is to provide an electroless plating method where light is shielded from the semiconductor substrate so that the photoelectric effect is eliminated in the semiconductor substrate.

In accordance with the objects of this invention, a new method of electroless plating a metal layer onto a semiconductor substrate in the manufacture of an integrated circuit device has been achieved. A semiconductor substrate is provided. A metal layer is electroless plated onto the semiconductor substrate. Light is shielded from the semiconductor substrate to thereby eliminate the photoelectric effect in the semiconductor substrate during the electroless plating.

Also in accordance with the objects of this invention, a new apparatus for electroless plating a metal layer onto a semiconductor substrate is achieved. The apparatus comprises, first, an electroless plating tank capable of holding an electroless plating solution. The sidewalls and bottom of said electroless plating tank prevent light intrusion into the electroless plating solution during a plating process. Second, a wafer fixture capable of suspending a semiconductor substrate wafer in the electroless plating solution in the electroless plating tank during the plating process is provided. Third, a light shielding cover capable of preventing light intrusion into the electroless plating solution through the top opening of the electroless plating tank during the plating process is provided.

BRIEF DESCRIPTION OF THE DRAWINGS

In the accompanying drawings forming a material part of this description, there is shown.

DESCRIPTION OF THE PREFERRED EMBODIMENTS

The embodiments disclose a method and an apparatus to electroless plate a metal layer onto a semiconductor substrate in the manufacture of an integrated circuit device. It should be clear to those experienced in the art that the present invention can be applied and extended without deviating from the scope of the present invention.

Figure 1:
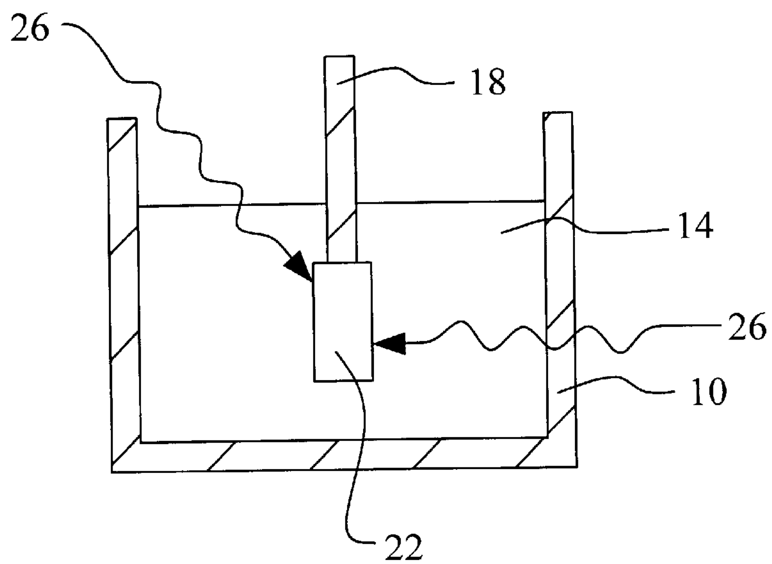
FIG. 1 schematically illustrates a simplified, cross sectional view of an electroless plating tank of the prior art apparatus.
Figure 2:
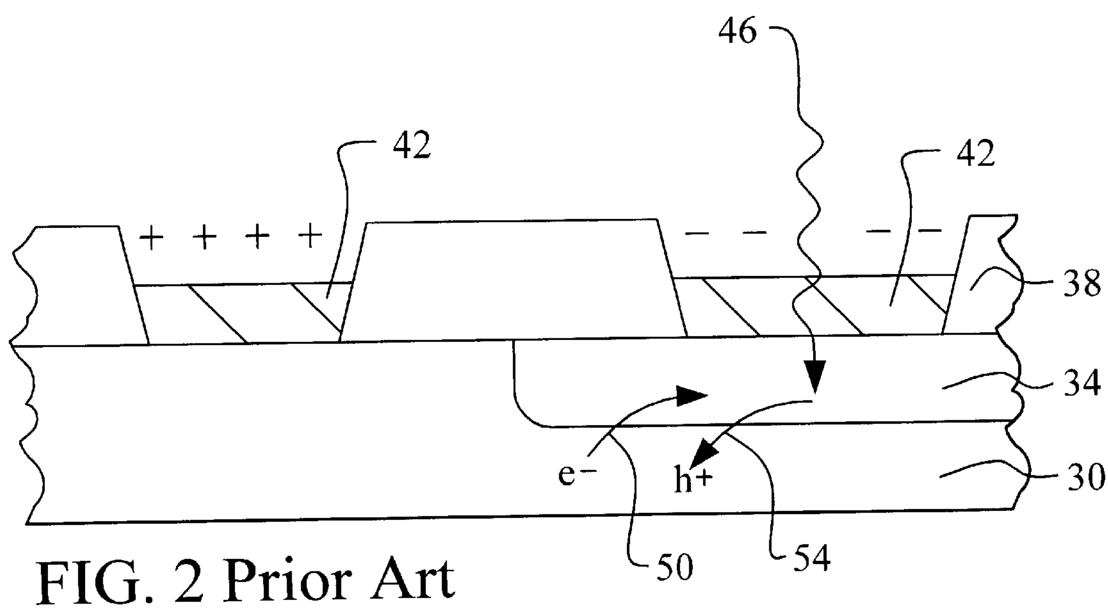
FIG. 2 schematically illustrates a partially completed integrated circuit device processed by electroless plating using the prior art method and apparatus.
Figure 3:
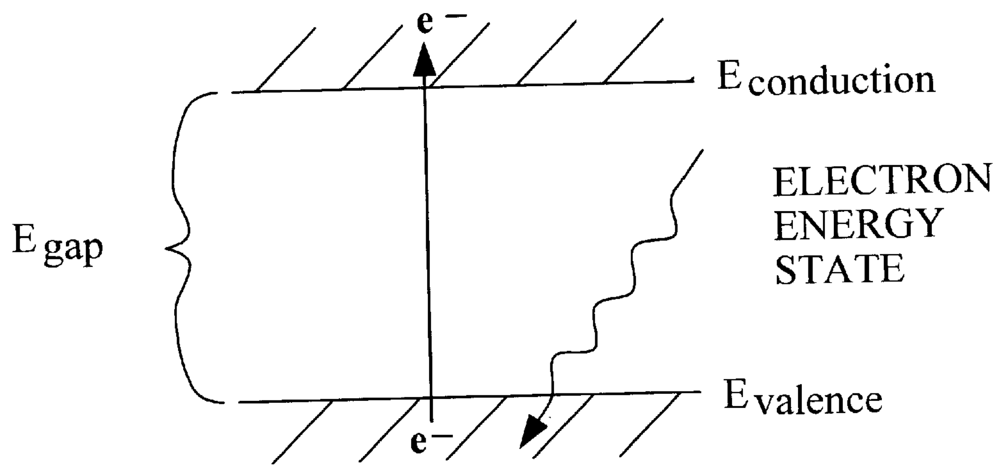
FIG. 3 illustrates an electron energy state diagram of the photoeletric effect found in semiconductor devices.
Figure 4:
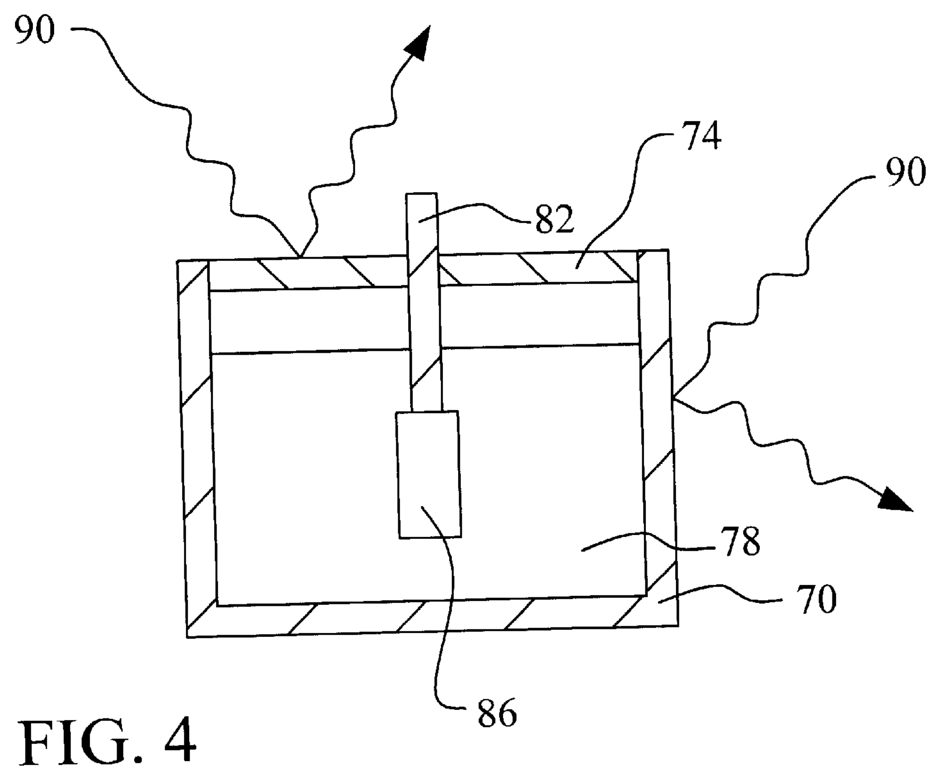
FIG. 4 schematically illustrates in a simplified, cross sectional representation of the preferred embodiment of the apparatus of the present invention.

Referring now particularly to FIG. 4, several important features of the apparatus and method of the present invention are described. FIG. 4 is a simplified, cross sectional representation of the electroless plating apparatus of the preferred embodiment. The apparatus comprises, first, an electroless plating tank 70. The electroless plating tank 70 is capable of holding the electroless plating solution 78. As in the prior art example, the plating solution 78 comprises a mixture of chemicals including a source of metal ions and a chemical reducing agent. The electroless plating tank 70 must therefore be capable of holding this solution 78 without reacting with the solution 78.

Of particular importance to the present invention, the electroless plating tank 70 must be capable of preventing ambient light 90 from intruding into the plating solution 78. The preferred electroless plating tank 70 is therefore constructed of a suitable chemical grade material that prevents light transmission. For example, the tank 70 may be constructed using a polymer material such as polyethylene. Alternatively, the tank 70 may be constructed using a metal, such as stainless steel, clad with a polymer material, such as polyethylene. Ambient light 90 is either absorbed or reflected from the electroless plating tank sidewalls and bottom as shown. This is an important feature of the present apparatus because ambient light must be eliminated from the electroless plating process to thereby eliminate the photoelectric effect outlined in the prior art example.

The second important component of the preferred apparatus is a wafer fixture 82 capable of suspending a semiconductor substrate wafer 86 in the electroless plating solution 78. The wafer fixture 82 preferably comprises the features typical to the art whereby a single wafer or a batch of wafers is held in the fixture during the plating process. A separate wafer cassette may be cradled or clipped to the wafer fixture as typical in the art. The wafer fixture must be constructed of a material that will not react with plating solution or with the semiconductor wafer 86.

For a process run, the wafer fixture 82 is capable of being placed in the up or loading position where the semiconductor wafer 86 can be loaded without contacting the plating solution 78. Then, the wafer fixture 82 is capable of being indexed to the down or plating position so that the wafer 86 is suspended in the plating solution 78. After the predetermined plating time has passed, the wafer fixture 82 is capable of being indexed to the finishing position whereby the wafer 86 is removed from the plating solution. In the finishing position, the wafer may be subjected to a rinsing step, such as in a de-ionized (DI) water rinse tank. Finally, the wafer fixture is capable of being again indexed to the up or loading position so that the wafer can be removed from the apparatus.

A third important feature of the preferred apparatus of the present invention is a light shielding cover 74 capable of preventing light intrusion through the top opening of the electroless plating tank 70 and into the electroless plating solution 78. The light shielding cover 74 prevents ambient light 90 intrusion by either absorbing or by reflecting this light. The light shielding cover 74 is preferably constructed of a non-transparent material that does not react with the plating solution 78 and that does not transmit the ambient light 90. The light shielding cover 74 comprises non-transparent materials. For example, the cover 74 may be constructed using a polymer material, such as polyethylene. Alternatively the cover 74 may be constructed using metal, such as stainless steel, clad with a polymer material, such as polyethylene.

The light shielding cover 74 may have openings so that the wafer fixture 82, including a loaded semiconductor wafer 86, can be indexed through the light shielding cover 74 during the process run. Alternatively, the light shielding cover 74 may have openings that only allow the connecting rod or arm of the wafer fixture 82 to pass through the cover 74. In this embodiment, the light shielding cover 74 would be placed over the electroless plating tank 70 opening after the wafer fixture 82 has indexed the semiconductor wafer 86 into the plating solution 78. If the electroless plating apparatus incorporates a vertical or lateral wafer fixture 82 movement to agitate the plating solution 78 during a process run, then these openings would allow this minimal movement while providing light isolation.

Alternatively, the wafer fixture 82 and the light shielding cover 74 may be fastened together so that the light shielding cover 74 is moved into place as the wafer fixture 82 indexes the semiconductor wafer 86 into the plating solution 78.

As previously disclosed, the light shielding cover 74 and the electroless plating tank 70 are constructed of material that does not permit the ambient light 90 to penetrate into the plating solution 78. In the preferred embodiment, the apparatus prevents intrusion of ambient light 90 having a wavelength of between about 100 nanometers and 650 nanometers.

Figure 5:
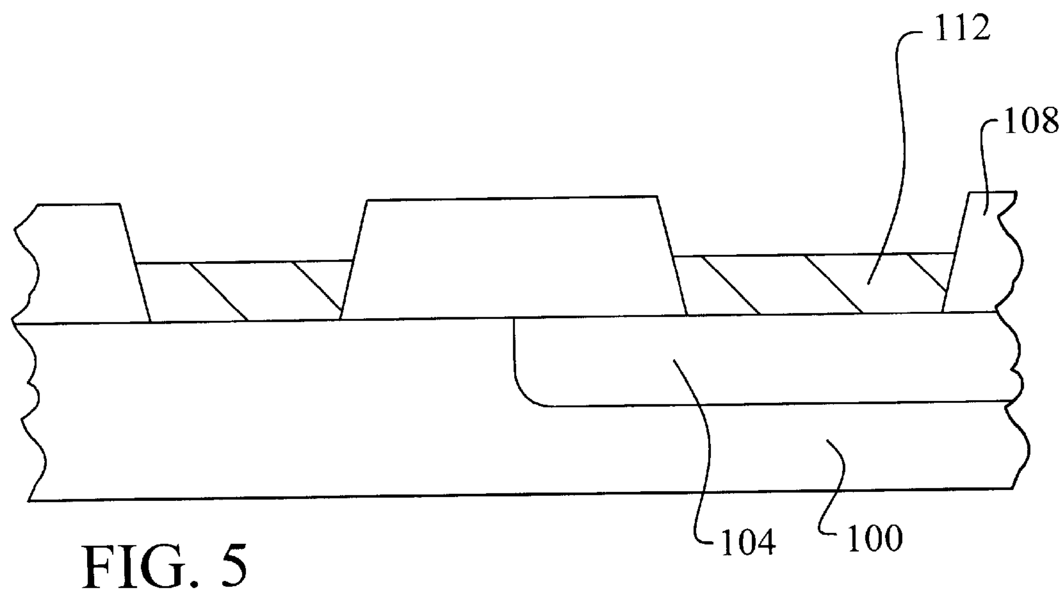
FIGS. 5 though 8 schematically illustrate in cross sectional representation a partially completed semiconductor device with a metal layer fabricated in the preferred embodiment of the method of the present invention.

Referring now to FIG. 5, the method of the present invention will be further disclosed. FIG. 5 illustrates a cross section of a partially completed prior art integrated circuit device. A bump pad process is herein used to explain the important features of the preferred embodiment of the method of the present invention.

A semiconductor substrate 100, preferably comprising monocrystalline silicon, is provided. A silicon substrate is chosen in this example because this type of substrate will exhibit the photoelectric effect discussed in the prior art analysis. As in the prior art case, the semiconductor substrate 100 is lightly doped p-type. An n-type well 104 is formed in the semiconductor substrate 100. A passivation layer 108, which may comprise several isolation layers, is formed overlying the surface of the semiconductor substrate 100. Openings have been formed in the passivation layer 108 for bonding pads to provide connectivity between the devices and structures of the semiconductor substrate 100 and the circuits external to the monolithic integrated circuit device. A first metal layer 112 has been deposited by typical processing to partially construct the bonding pad. In this example, an aluminum layer 112 has been deposited by, for example, a sputtering process.

Figure 6:
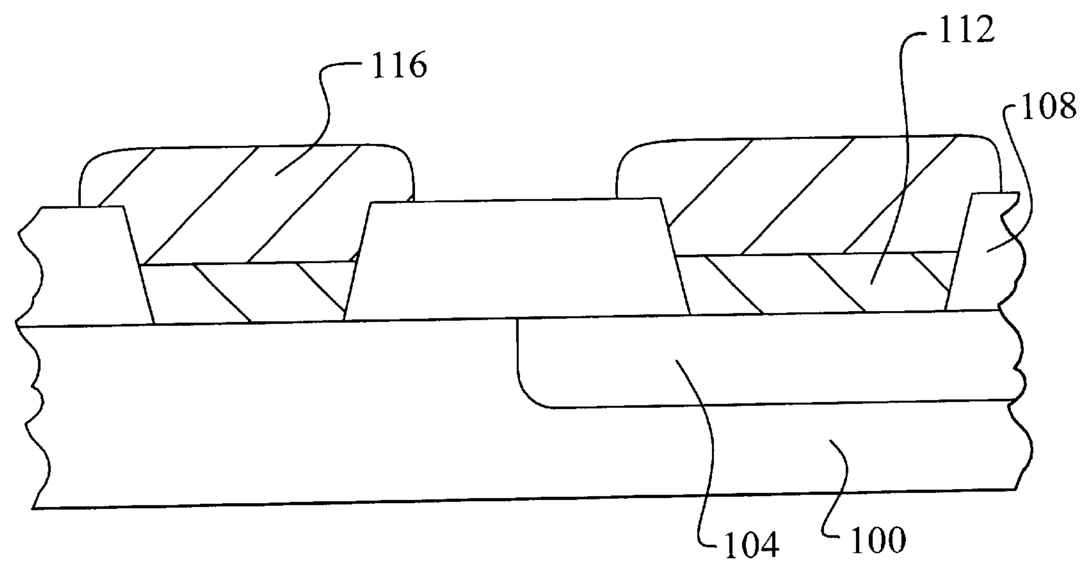

The partially completed integrated circuit device is now subjected to the electroless plating method of the present invention. As shown in FIG. 6, a second metal layer 116 is deposited overlying the first metal layer and filling the pad openings. This second metal layer 116 may be any metal layer that can be deposited using an electroless plating process. For example, the second metal layer 116 may comprise Ni, Au, Pt, Pd, or Cu.

In this example, the bonding pads fabricated will be of the bump type. A bump pad is a type of pad that allows the integrated circuit to be applied directly to a circuit board or circuit substrate without prior packaging. The individual integrated circuit die is flipped onto the circuit board or substrate and adheres to the surface using a solder reflow process. Alternatively, the method of the present invention may be used to deposit a metal layer that is used to form a wire bonding pad. In a wire bonding pad application, the individual integrated circuit die is adhered to a lead frame.

Wires are then connected between each wire bonding pad and pin location on the lead frame. Finally, the lead frame and circuit die are encapsulated in a plastic package.

In the preferred method of the present invention, the partially completed integrated circuit wafer depicted in FIG. 5 is processed in the electroless plating tank to deposit the second metal layer 116 of FIG. 6. The plating solution comprises a mixture of chemicals including a source of metal ions and a chemical reducing agent. For example, the plating solution may comprise: Ni ions, Au ions, Pt ions, Pd ions, or Cu ions in a standard electroless plating solution.

Of particular importance to the method of the present invention is the fact that the electroless plating reaction occurs in the absence of light. The semiconductor substrate wafer is suspended in an electroless plating solution that is isolated from all ambient light sources. In the preferred embodiment, ambient light at a wavelength of between about 100 nanometers and 650 nanometers is eliminated. As was found in the prior art case, the presence of light can cause a photoelectric effect in the semiconductor substrate 100. By eliminating the ambient light penetration into the plating solution, the photoelectric effect is eliminated. By this method, the second metal layer 116 is reliably deposited onto the first metal layer 112 to a thickness of between about 2 microns and 20 microns.

Figure 7:
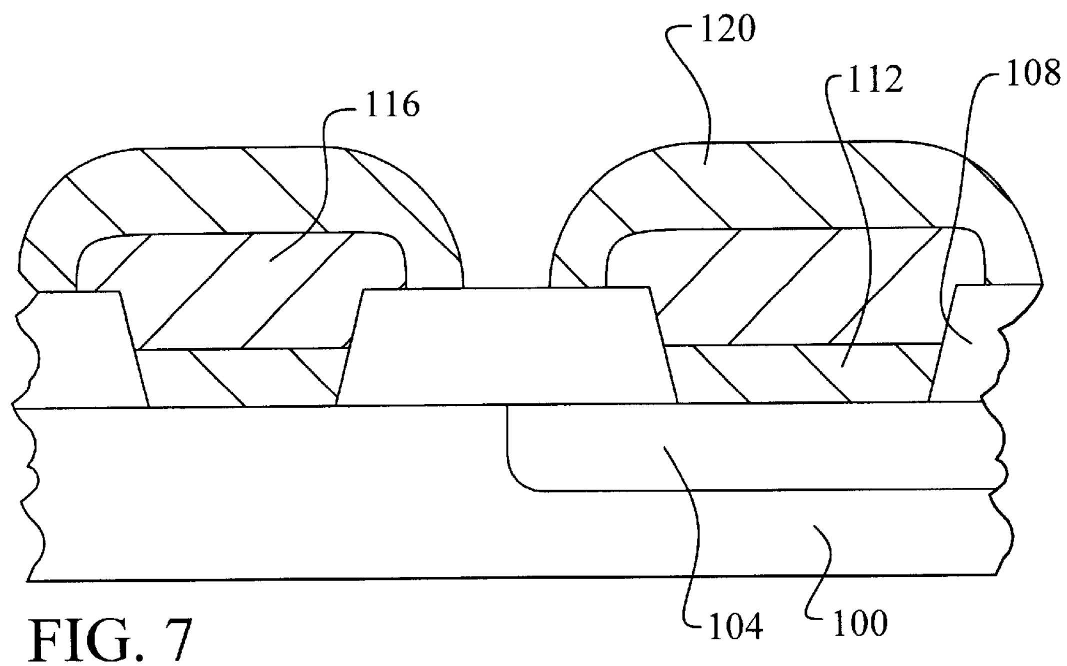

Referring now to FIG. 7, a solder layer 120, typically comprising a combination of tin and lead, is applied to integrated circuit. The solder layer 120 is applied using a solder screen printing process where the solder is forced through a perforated screen onto the integrated circuit surface.

Figure 8:
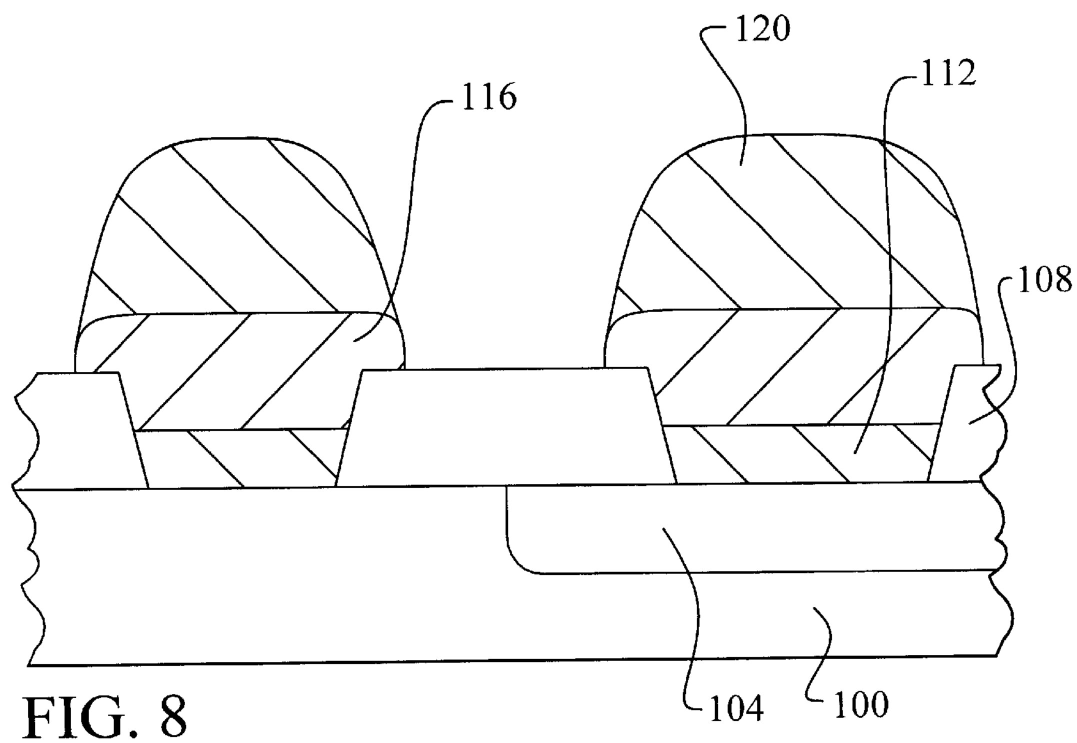

Referring now to FIG. 8, the semiconductor substrate is subjected to a solder reflow process. In the reflow process, the wafer is heated to cause the solder layer 120 to melt or flow. The wetting and surface tension action of the melted solder causes the solder layer to form raised bumps as shown in the illustration. The bump pad is thereby completed.

As shown in the preferred embodiments, the present invention provides an effective apparatus and a very manufacturable method to electroless plate a metal layer in the manufacture of a semiconductor device. The apparatus provides a novel and unique method to shield the electroless plating solution from ambient light. The method applies a light shielded electroless plating process to the plating of metal layer for use in the formation of a wire bonding pad or a bump pad.

While the invention has been particularly shown and described with reference to the preferred embodiments thereof, it will be understood by those skilled in the art that various changes in form and details may be made without departing from the spirit and scope of the invention.

What is claimed is:

1. A method of electroless plating a metal layer onto a semiconductor substrate in the manufacture of an integrated circuit device comprising:

providing a semiconductor substrate; and electroless plating a metal layer onto said semiconductor substrate wherein said electroless plating is performed in a plating tank and wherein sidewalls, bottom, and top cover of said plating tank prevent light intrusion into said plating tank to thereby eliminate the photoelectric effect during said electroless plating.

2. The method according to claim 1 wherein said semiconductor substrate comprises silicon dioxide.

3. The method according to claim 1 wherein said semiconductor substrate contains n-type and p-type regions.

4. The method according to claim 1 wherein said metal layer comprises one of the group of: Ni, Au, Pt, Pd, and Cu.

5. The method according to claim 1 wherein said metal layer forms a part of an integrated circuit pad of the group of: wire bonding pad and bump pad.

6. The method according to claim 1 wherein said shielding eliminates said light having a wavelength of between about 100 nanometers and 650 nanometers.

7. The method according to claim 1 wherein said step electroless plating uses a plating solution comprising one of the group of: Ni ions, Au ions, Pt ions, Pd ions, and Cu ions in a standard electroless plating solution.

8. A method of electroless plating a metal layer onto a semiconductor substrate in the manufacture of an integrated circuit device comprising:

providing a semiconductor substrate; and electroless plating a metal layer onto said semiconductor substrate wherein said electroless plating is performed in a plating tank and wherein sidewalls, bottom, and top cover of said plating tank prevent light intrusion into said plating tank to thereby eliminate the photoelectric effect during said electroless plating, wherein said metal layer comprises one of the group of: Ni, Au, Pt, Pd, and Cu and wherein said shielding eliminates said light having a wavelength of between about 100 nanometers and 650 nanometers.

9. The method according to claim 8 wherein said semiconductor substrate comprises silicon dioxide.

10. The method according to claim 8 wherein said semiconductor substrate contains n-type and p-type regions.

11. The method according to claim 8 wherein said metal layer forms a part of an integrated circuit wire bonding pad.

12. The method according to claim 8 wherein said metal layer forms a part of an integrated circuit bump pad.

13. The method according to claim 8 wherein said step electroless plating uses a plating solution comprising one of the group of: Ni ions, Au ions, Pt ions, Pd ions, and Cu ions in a standard electroless plating solution.

14. A method of electroless plating a metal layer onto a semiconductor substrate in the manufacture of an integrated circuit device comprising:

providing a semiconductor substrate; and electroless plating a metal layer onto said semiconductor substrate wherein said electroless plating is performed in a plating tank, wherein sidewalls, bottom, and top cover of said plating tank prevent light intrusion into-said plating tank to thereby eliminate the photoelectric effect during said electroless plating, and wherein said sidewall, bottom, and top cover comprise a non-transparent, polymer material.

15. The method according to claim 14 wherein said semiconductor substrate comprises silicon dioxide.

16. The method according to claim 14 wherein said semiconductor substrate contains n-type and p-type regions.

17. The method according to claim 14 wherein said metal layer is selected from the group consisting of: Ni, Au, Pt, Pd, and Cu.

18. The method according to claim 14 wherein said metal layer forms a part of an integrated circuit pad selected from the group consisting of: wire bonding pad and bump pad.

19. The method according to claim 14 wherein said shielding eliminates said light having a wavelength of between about 100 nanometers and 650 nanometers.

20. The method according to claim 14 wherein said step electroless plating uses a plating solution selected from the group consisting of: Ni ions, Au ions, Pt ions, Pd ions, and Cu ions in a standard electroless plating solution.

* * * * *